(12) United States Patent
Rathburn

(10) Patent No.: US 8,984,748 B2
(45) Date of Patent: *Mar. 24, 2015

(54) SINGULATED SEMICONDUCTOR DEVICE SEPARABLE ELECTRICAL INTERCONNECT

(75) Inventor: James Rathburn, Mound, MN (US)

(73) Assignee: Hsio Technologies, LLC, Maple Grove, MN (US)

( * ) Notice: Subject to any disclaimer, the term of this patent is extended or adjusted under 35 U.S.C. 154(b) by 593 days.

This patent is subject to a terminal disclaimer.

(21) Appl. No.: 13/319,228

(22) PCT Filed: Jun. 28, 2010

(86) PCT No.: PCT/US2010/040197
§ 371 (c)(1),
(2), (4) Date: Nov. 7, 2011

(87) PCT Pub. No.: WO2011/002712
PCT Pub. Date: Jan. 6, 2011

(65) Prior Publication Data
US 2012/0058653 A1    Mar. 8, 2012

Related U.S. Application Data

(60) Provisional application No. 61/221,380, filed on Jun. 29, 2009.

(51) Int. Cl.
*H05K 3/32* (2006.01)
*G01R 3/00* (2006.01)
(Continued)

(52) U.S. Cl.
CPC ................ *G01R 3/00* (2013.01); *G01R 1/0491* (2013.01); *G01R 1/0735* (2013.01)
USPC ................... 29/854; 29/874; 29/884; 29/846; 29/830; 29/831; 439/76.1

(58) Field of Classification Search
CPC ......... H05K 3/007; H05K 3/02; H05K 3/101; H05K 3/107; H05K 3/325; H05K 3/365; H05K 3/4007; G01R 3/00; G01R 1/0466; G01R 1/0483
USPC .................. 29/854, 874, 884, 846, 830, 831; 439/76.1

See application file for complete search history.

(56) References Cited

U.S. PATENT DOCUMENTS 3,672,986 A    6/1972   Schneble, Jr. et al.
4,188,438 A    2/1980   Burns
(Continued)

FOREIGN PATENT DOCUMENTS

JP    2003/217774    7/2003
WO   WO 91/14015    9/1991
(Continued)

OTHER PUBLICATIONS

Office Action mailed Feb. 21, 2014 in co-pending U.S. Appl. No. 13/266,573, now published as US Patent Application Publication No. 2012/0061846.
(Continued)

*Primary Examiner* — David Angwin
*Assistant Examiner* — Kaying Kue
(74) *Attorney, Agent, or Firm* — Stoel Rives LLP

(57) ABSTRACT

A socket assembly that forms a solderless electrical interconnection between terminals on a singulated integrated circuit device and another circuit member. The socket housing has an opening adapted to receive the singulated integrated circuit device. The compliant printed circuit is positioned relative to the socket housing to electrically couple with the terminals on a singulated integrated circuit device located in the opening. The compliant printed circuit includes a dielectric base layer printed onto a surface of a fixture, while leaving cavities in the surface of the fixture exposed. A plurality of contact members are formed in the plurality of cavities in the fixture and coupled to the dielectric base layer. The contact members are exposed wherein the compliant printed circuit is removed from the fixture. At least one dielectric layer with recesses corresponding to a target circuit geometry is printed on the dielectric base layer. A conductive material is deposited in at least a portion of the recesses to form conductive traces electrically coupling the contact members to the other circuit member.

12 Claims, 16 Drawing Sheets

(51) Int. Cl.
*G01R 1/04* (2006.01)
*G01R 1/073* (2006.01)

(56) References Cited

U.S. PATENT DOCUMENTS

| | | |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,072,520 A | 12/1991 | Nelson |
| 5,127,837 A | 7/1992 | Shah et al. |
| 5,129,573 A | 7/1992 | Duffey |
| 5,161,983 A | 11/1992 | Ohno |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,791,911 A | 8/1998 | Fasano et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,925,931 A | 7/1999 | Yamamoto |
| 5,933,558 A | 8/1999 | Sauvageau et al. |
| 6,020,597 A | 2/2000 | Kwak |
| 6,062,879 A | 5/2000 | Beaman et al. |
| 6,080,932 A | 6/2000 | Smith et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey et al. |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert et al. |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,312,971 B1 | 11/2001 | Amundson et al. |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler et al. |
| 6,422,687 B1 | 7/2002 | Jacobson |
| 6,437,452 B2 | 8/2002 | Lin |
| 6,459,418 B1 | 10/2002 | Comiskey |
| 6,461,183 B1 | 10/2002 | Ohkita |
| 6,462,418 B2 | 10/2002 | Sakamoto et al. |
| 6,477,286 B1 | 11/2002 | Ouchi |
| 6,506,438 B2 | 1/2003 | Duthaler et al. |
| 6,521,489 B2 | 2/2003 | Duthaler |
| 6,545,291 B1 | 4/2003 | Amundson |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,750,551 B1 | 6/2004 | Frutschy et al. |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,422,439 B2 | 9/2008 | Rathburn et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,508,076 B2 | 3/2009 | Japp et al. |
| 7,527,502 B2 | 5/2009 | Li |
| 7,537,461 B2 | 5/2009 | Rathburn |
| 7,538,415 B1 | 5/2009 | Lin et al. |

(56) References Cited

U.S. PATENT DOCUMENTS

| | | |
|---|---|---|
| 7,548,430 B1 | 6/2009 | Huemoeller et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,748,110 B2 | 7/2010 | Asahi et al. |
| 7,800,916 B2 | 9/2010 | Blackwell et al. |
| 7,833,832 B2 | 11/2010 | Wood et al. |
| 7,868,469 B2 | 1/2011 | Mizoguchi |
| 7,897,503 B2 | 3/2011 | Foster et al. |
| 7,898,087 B2 | 3/2011 | Chainer |
| 7,999,369 B2 | 8/2011 | Malhan et al. |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | Mcelrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,346 B2 | 9/2013 | Rathburn |
| 8,536,714 B2 | 9/2013 | Sakaguchi |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 * | 7/2014 | Rathburn ................. 29/846 |
| 8,803,539 B2 * | 8/2014 | Rathburn ................. 324/755.01 |
| 8,829,671 B2 | 9/2014 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0164527 A1 | 7/2005 | Radza et al. |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson et al. |
| 2006/0087064 A1 | 4/2006 | Daniel et al. |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chavineau-Lovgren |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer, et al |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0022105 A1 | 1/2010 | Di Stefano |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |

(56) References Cited

U.S. PATENT DOCUMENTS

| | | | |
|---|---|---|---|
| 2012/0049877 A1 | 3/2012 | Rathburn | |
| 2012/0051016 A1 | 3/2012 | Rathburn | |
| 2012/0055701 A1 | 3/2012 | Rathburn | |
| 2012/0055702 A1 | 3/2012 | Rathburn | |
| 2012/0056332 A1 | 3/2012 | Rathburn | |
| 2012/0056640 A1* | 3/2012 | Rathburn | 324/762.03 |
| 2012/0058653 A1* | 3/2012 | Rathburn | 439/76.1 |
| 2012/0061846 A1 | 3/2012 | Rathburn | |
| 2012/0061851 A1 | 3/2012 | Rathburn | |
| 2012/0062270 A1 | 3/2012 | Rathburn | |
| 2012/0068727 A1* | 3/2012 | Rathburn | 324/755.01 |
| 2012/0161317 A1 | 6/2012 | Rathburn | |
| 2012/0164888 A1 | 6/2012 | Rathburn | |
| 2012/0168948 A1 | 7/2012 | Rathburn | |
| 2012/0171907 A1 | 7/2012 | Rathburn | |
| 2012/0182035 A1 | 7/2012 | Rathburn | |
| 2012/0199985 A1 | 8/2012 | Rathburn | |
| 2012/0202364 A1 | 8/2012 | Rathburn | |
| 2012/0244728 A1 | 9/2012 | Rathburn | |
| 2012/0252164 A1 | 10/2012 | Nakao et al. | |
| 2012/0257343 A1 | 10/2012 | Das et al. | |
| 2012/0268155 A1 | 10/2012 | Rathburn | |
| 2013/0078860 A1 | 3/2013 | Rathburn | |
| 2013/0105984 A1 | 5/2013 | Rathburn | |
| 2013/0203273 A1 | 8/2013 | Rathburn | |
| 2013/0206468 A1 | 8/2013 | Rathburn | |
| 2013/0210276 A1 | 8/2013 | Rathburn | |
| 2013/0223034 A1* | 8/2013 | Rathburn | 361/767 |
| 2013/0244490 A1 | 9/2013 | Rathburn | |
| 2013/0330942 A1 | 12/2013 | Rathburn | |
| 2014/0043782 A1 | 2/2014 | Rathburn | |
| 2014/0080258 A1 | 3/2014 | Rathburn | |
| 2014/0192498 A1 | 7/2014 | Rathburn | |
| 2014/0220797 A1 | 8/2014 | Rathburn | |
| 2014/0225255 A1 | 8/2014 | Rathburn | |
| 2014/0242816 A1 | 8/2014 | Rathburn | |

FOREIGN PATENT DOCUMENTS

| | | |
|---|---|---|
| WO | WO 2006/039277 | 4/2006 |
| WO | WO 2006/124597 | 11/2006 |
| WO | WO2008/156856 | 12/2008 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Amendment and Response filed Feb. 26, 2014 in co-pending U.S. Appl. No. 13/266,573, now published as US Patent Application Publication No. 2012/0061846.

Amendment and Response filed Jan. 3, 2014 in co-pending U.S. Appl. No. 13/266,907, now published as US Patent Application Publication No. US 2012/0268155.

Supplemental Amendment and Response filed Jan. 29, 2014 in co-pending U.S. Appl. No. 13/266,907, now published as US Patent Application Publication No. US 2012/0268155.

Office Action mailed Jan. 3, 2014 in co-pending U.S. Appl. No. 13/318,038, now published as US Patent Application Publication No. US 2012/0062270.

Office Action mailed Feb. 14, 2014 in co-pending U.S. Appl. No. 13/318,171, now published as US Patent Application Publication No. US 2012/0049877.

Amendment and Response filed Feb. 26, 2014 in co-pending U.S. Appl. No. 13/318,171, now published as US Patent Application Publication No. US 2012/0049877.

Response Restriction Requirement filed Jan. 28, 2014 in co-pending U.S. Appl. No. 13/318,181, now published as US Patent Application Publication No. US 2012/0044659.

Response to Advisory Action filed Dec. 6, 2013 in co-pending U.S. Appl. No. 13/318,200, now published as US Patent Application Publication No. US 2012/0056332.

Request for Continued Examination filed Feb. 11, 2014 in co-pending U.S. Appl. No. 13/318,200, now published as US Patent Application Publication No. US 2012/0056332.

Final Office Action mailed Jan. 8, 2014 in co-pending U.S. Appl. No. 13/320,285, now published as US Patent Application Publication No. US 2012/0055702.

Amendment and Response to Final Office filed Feb. 18, 2014 in co-pending U.S. Appl. No. 13/320,285, now published as US Patent Application Publication No. US 2012/0055702.

Advisory Action mailed Feb. 26, 2014 in co-pending U.S. Appl. No. 13/320,285, now published as US Patent Application Publication No. US 2012/0055702.

Office Action mailed Jan. 17, 2014 in co-pending U.S. Appl. No. 13/319,120 now published as US Patent Application Publication No. US 2012/0061851.

Office Action mailed Dec. 26, 2013 in co-pending U.S. Appl. No. 13/319,145, now published as US Patent Application Publication No. 2012/0049342.

Restriction Requirement mailed Jan. 30, 2014 in co-pending U.S. Appl. No. 13/319,158, now published as US Patent Application Publication No. 2012/0051016.

Response to Restriction Requirement filed Feb. 6, 2014 in co-pending U.S. Appl. No. 13/319,158, now published as US Patent Application Publication No. 2012/0051016.

Office Action mailed Feb. 27, 2014 in co-pending U.S. Appl. No. 13/319,203, now published as US Patent Application Publication No. 2012/0056640.

Restriction Requirement mailed Feb. 7, 2014 in co-pending U.S. Appl. No. 13/575,368, now published as US Patent Application Publication No. 2013/0203273.

Response to Restriction Requirement filed Feb. 19, 2014 in co-pending U.S. Appl. No. 13/575,368, now published as US Patent Application Publication No. 2013/0203273.

Office Action mailed Mar. 4, 2014 in co-pending U.S. Appl. No. 13/575,368, now published as US Patent Application Publication No. 2013/0203273.

Notice of Allowance and Fee(s) Due mailed Feb. 26, 2014 in co-pending U.S. Appl. No. 13/412,870, now published as US Patent Application Publication No. US 2012/0171907.

Final Office Action mailed Feb. 14, 2014 in co-pending U.S. Appl. No. 13/413,724, now published as US Patent Application Publication No. US 2012/0168948.

Amendment and Response to Final Office filed Feb. 26, 2014 in co-pending U.S. Appl. No. 13/413,724, now published as US Patent Application Publication No. US 2012/0168948.

(56) References Cited

OTHER PUBLICATIONS

Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.

(56) References Cited

OTHER PUBLICATIONS

Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-to-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.

(56) References Cited

OTHER PUBLICATIONS

Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Complaint Printed Circuit Semiconductor Testet Interface, filed Nov. 7, 2011.
Co-pending U.S. Appl. No. 13/575,368, titled High Speed Backplane Connector, filed Jul. 26, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Print—Definition of Print by The Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.

(56) References Cited

OTHER PUBLICATIONS

Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/016131 7.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application NO. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.

Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.

(56) References Cited

OTHER PUBLICATIONS

Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.

* cited by examiner

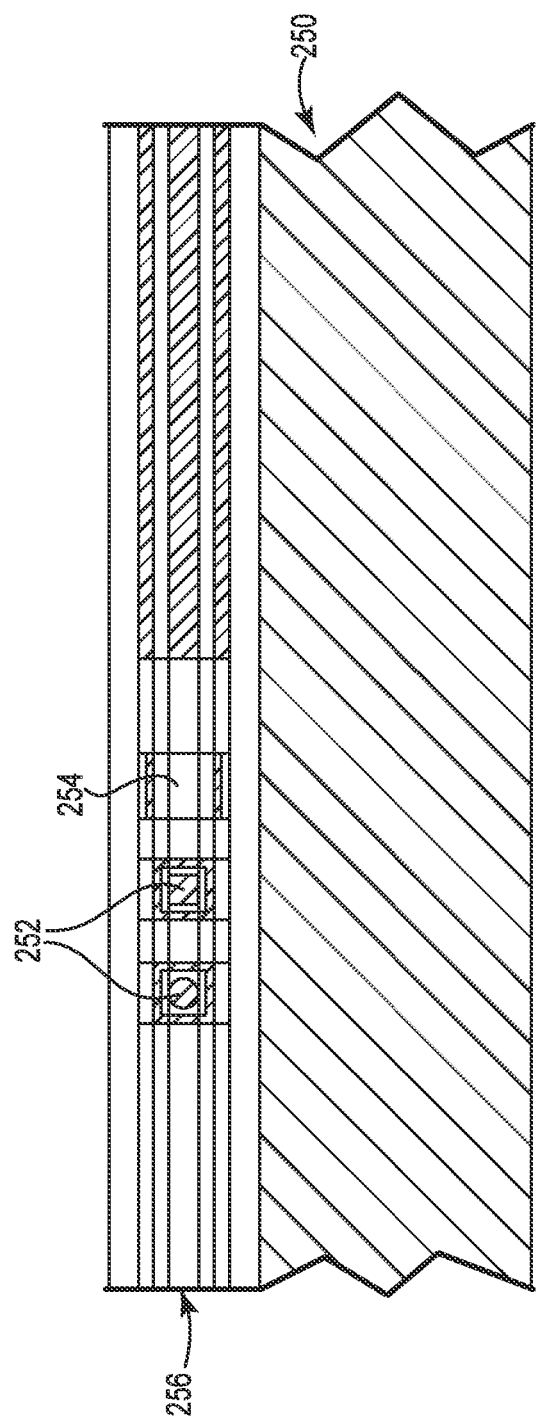

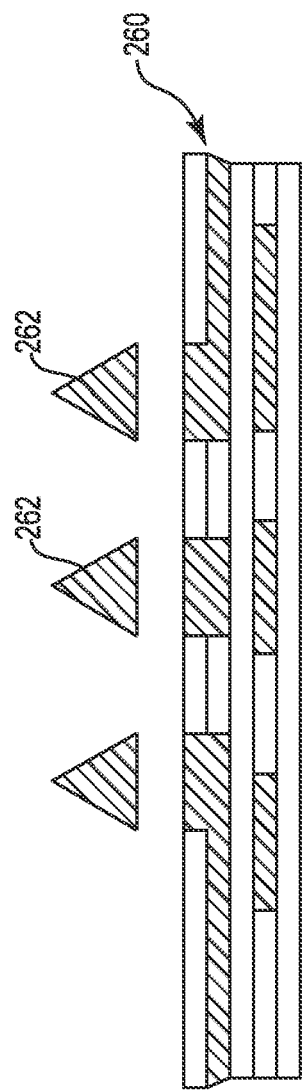

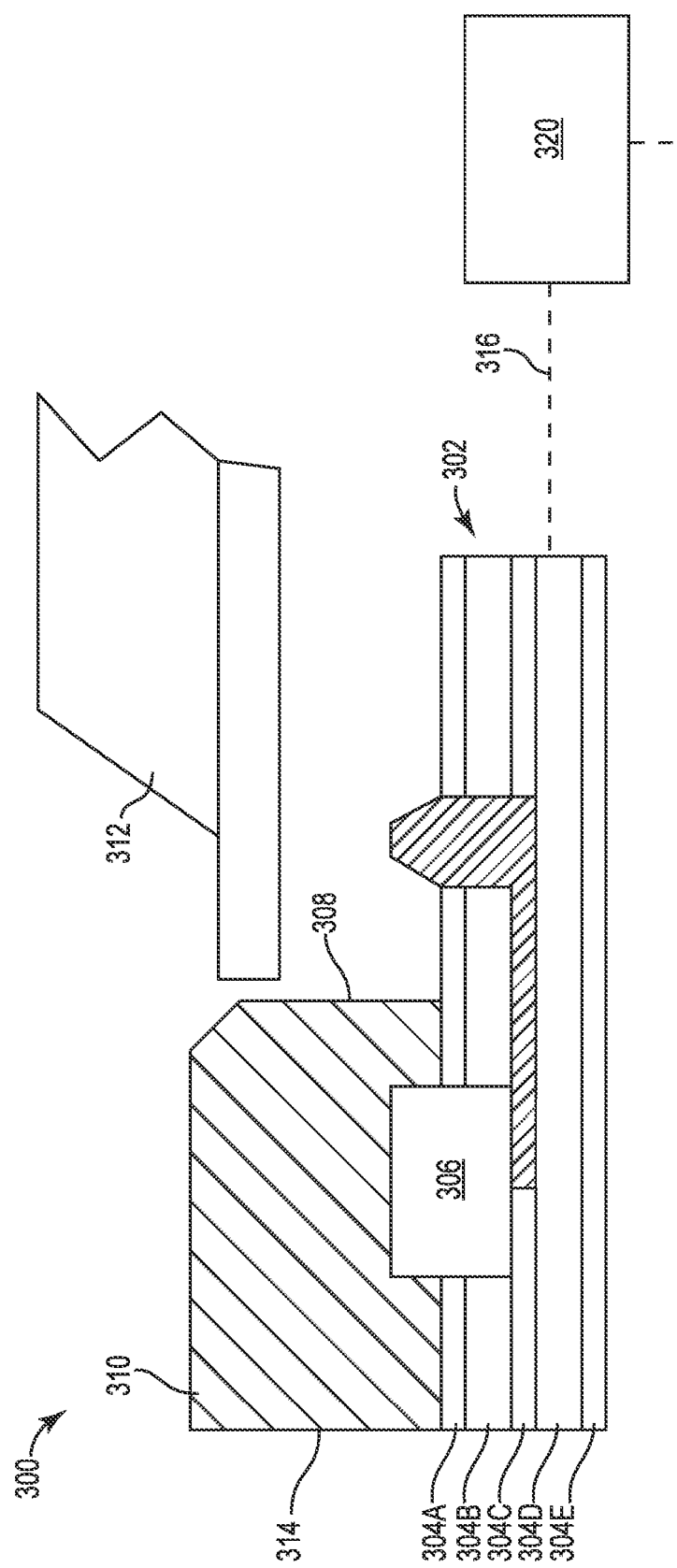

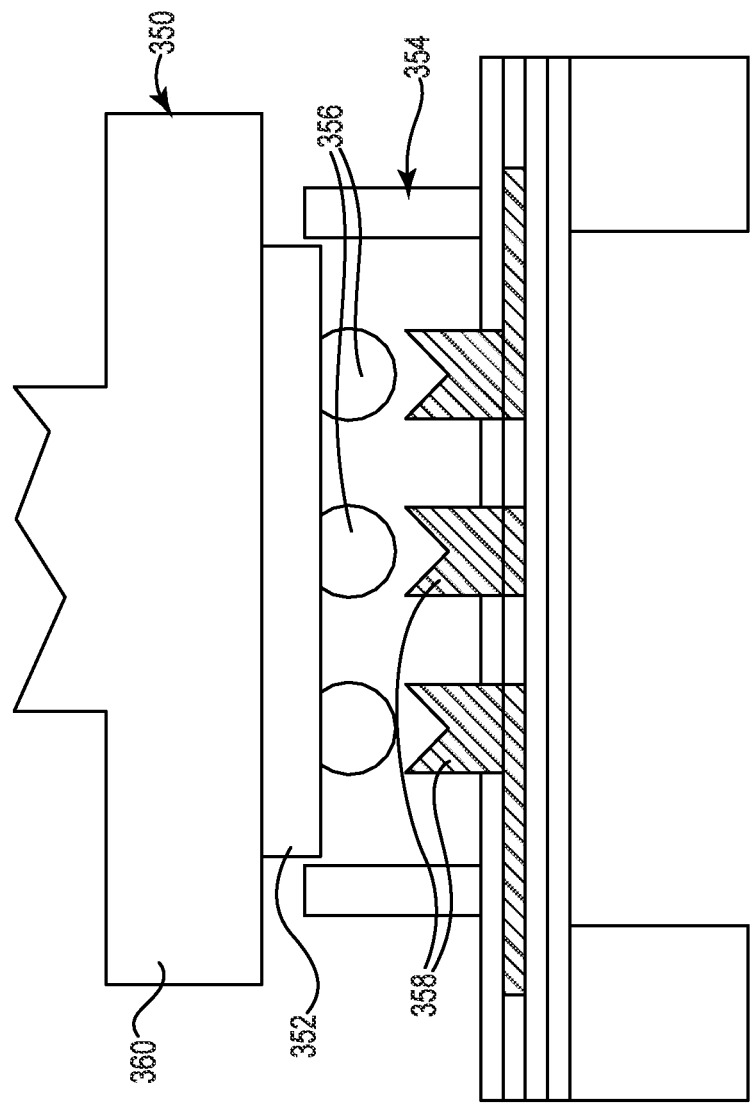

SINGULATED SEMICONDUCTOR DEVICE SEPARABLE ELECTRICAL INTERCONNECT

TECHNICAL FIELD

The present disclosure relates to a socket assembly produced using additive printing processes that is capable of interconnecting one or more singulated die devices in a separable or solderless fashion to another circuit member, such as for example a test station. The present socket assembly allows the singulated die devices to be tested prior to final packaging.

BACKGROUND OF THE INVENTION

Traditional semiconductors and IC devices are typically formed on a substrate using photolithography. The substrate may be a silicon wafer. Multiple IC devices are typically formed on a single wafer and then the wafer is cut into die. The IC devices are typically packaged in a variety of ways to provide redistribution from the terminals on the die to a spacing that is conducive to cost effective printed circuit board (PCB) fabrication techniques. The package also serves to protect the fragile silicon or provide additional functions such as thermal management or near device decoupling. In many cases, the size and distance between die terminals is so small that the IC device cannot be connected to the final PCB without some sort of re-routing interface. In such cases, the package can provide the re-routing interface.

Most IC devices are produced with terminals in either a peripheral pattern that runs along the edges of the IC device or an area array pattern that spans across the surface of the IC device. A main method for attachment when the terminals are in an area array pattern is to connect the terminals with solder. Basically, the package has an array of terminals that correspond to the IC device terminals. Solder is applied to the terminals on the IC device and/or the package and reflowed to create the mechanical and electrical connection in a process commonly called flip chip attachment. In a flip chip attachment the IC device is flipped over to mate the terminals on the die to the terminals on the IC package substrate.

After IC device is positioned in this type of package and attached to the package terminals, the package is often under filled with an epoxy of some type to provide support and strength to the solder joints. The epoxy protects the solder joints from thermal expansion, miss-match and/or shock during use. Regardless of whether a package is under filled with epoxy, the connection of the IC device to the package is generally not reworkable after packaging, and if there is a missing or broken connection it is difficult to repair.

Once the IC devices are packaged, the IC devices are usually tested in a variety of ways to determine the reliability and performance of the IC devices in the package. The IC devices may be tested as they would be used in a final application. In many cases, the functional performance of the IC device is not known prior to placing it into the package. If the packaged IC device fails testing then the cost of the package and manufacturing process is lost.

Area array packaging has been utilized for many years, and provides a method for interconnecting IC devices with larger terminal counts than peripheral lead packaging. In general, the area array packaging is more expensive due to the larger pin counts and more sophisticated substrates required. The limitations for area array packaging include the terminal pitch, thermal management, cost, ability to rework faulty IC devices and reliability of the solder joints.

There also have been advancements in recent years in both area array packaging and peripheral lead packaging where multiple IC devices are placed in the same package, creating what has been nicknamed SiP for "system in package." Placing multiple IC devices in a single package further complicates the problems discussed above.

BRIEF SUMMARY OF THE INVENTION

The present disclosure relates to a socket assembly that forms a solderless electrical interconnection between a singulated bare-die integrated circuit device (referred to herein as an "IC device") and another circuit member. The present socket assembly provides a very high frequency interface for an IC device with fine pitch terminals. The present socket assembly allows the IC device to be tested prior to final packaging. The other circuit member can be a printed circuit board, a test assembly, or any other electrical device.

One embodiment is directed to a socket assembly that forms a solderless electrical interconnection between terminals on a singulated integrated circuit device and another circuit member. The socket housing has an opening adapted to receive the singulated integrated circuit device. The compliant printed circuit is positioned relative to the socket housing to electrically couple with the terminals on a singulated integrated circuit device located in the opening. The compliant printed circuit includes a dielectric base layer printed onto a surface of a fixture, while leaving cavities in the surface of the fixture exposed. A plurality of contact members are formed in the plurality of cavities in the fixture and coupled to the dielectric base layer. The contact members are exposed wherein the compliant printed circuit is removed from the fixture. At least one dielectric layer with recesses corresponding to a target circuit geometry is printed on the dielectric base layer. A conductive material is deposited in at least a portion of the recesses comprising conductive traces electrically coupling the contact members to the other circuit member.

The conductive traces preferably have substantially rectangular cross-sectional shapes. In one embodiment, a conductive material, a non-conductive material, and a semi-conductive material are printed on a single layer of the compliant printed circuit. Additional circuitry planes can be printed on the compliant printed circuit, such as for example, a ground plane, a power plane, an electrical connection to other circuit members, a dielectric layer, and a flexible circuit.

The contact members can be formed from one of a curable conductive material, sintered conductive particles, conductive inks, and the like. In one embodiment, a flexible circuit member electrically coupled to the conductive traces extends beyond a perimeter edge of the socket assembly and is connected to a test station.

One or more electrical devices can be printed on the compliant printed circuit and electrically coupled to one or more of the conductive traces. The electrical devices can be selected from the group consisting of a power plane, ground plane, capacitor, resistor, filters, signal or power altering and enhancing device, capacitive coupling feature, memory device, embedded integrated circuit, and RF antennae. Optical quality material can also be deposited in at least a portion of the recesses to create one or more optical circuit geometries. In another embodiment, one or more optical fibers are located in at least a portion of the recesses.

There are few or no commercial products available today to allow a semiconductor manufacturer to validate the IC device directly off of the singulated die, with process or performance information provided in a manner much faster than if the die is tested after packaging. In most cases today, in order to provide any high performance test capability, the user must probe the die in an expensive wafer probe system with expensive probes. In many cases, full functionally testing of the IC device on the wafer is not possible. The present socket assembly allows the user to power and manage the IC device to be tested. This test capability allows the IC device manufacturer to segregate the performance of the IC devices before packaging vs. after packaging.

The ability to build multi-layer structures compliant printed circuit with a relatively large surface area is a major advantage, and the ability to add electrical enhancements provides performance advantages over existing probe products. For example, the ability to add programmable logic, transistors, and memory device to the present socket assembly provides an opportunity to incorporate test intelligence into the assembly, extending the use of legacy test equipment or improving the test performance of the system.

Transistors and memory printed into the socket assembly provide adaptive testing or the ability to alter the circuit being tested. The present socket assembly also permits interconnecting a group of IC devices to simulate a multi-chip or system-in-package configuration, so that the IC devices can be tested in relation to the other chips they will eventually be expected to interact with.

The present socket assembly provides a low cost alternative to other socket products, by utilizing an additive printing process and unique contact member fabrication process. The nature of the process can allow for very high frequency performance, as well as the addition of on-board electrical devices and circuitry planes that are not available with other socket products. The present socket assembly can be superior to membrane socket products in terms of mechanical performance, manufacturing complexity, electrical performance, and cost.

The present disclosure is also directed to a method of making a socket assembly that forms a solderless electrical connection between terminals on a singulated integrated circuit device and another circuit member. A base layer of a dielectric material is printed onto a surface of a fixture, while leaving cavities in the fixture exposed. A conductive material is printed into a plurality of the cavities in the fixture. At least one dielectric layer is printed with recesses corresponding to a target circuit geometry on the dielectric base layer. A conductive material is deposited in at least a portion of the recesses comprising conductive traces electrically coupled to the contact members of a compliant printed circuit. The compliant printed circuit is removed from the fixture to expose distal ends of the contact members. The compliant printed circuit is positioned relative to an opening in a socket housing so the contact members electrically couple with the terminals on a singulated integrated circuit device located in the opening. Compliant layers can optionally be printed on the compliant printed circuit to increase performance of the present socket assemblies.

The present disclosure is also directed to a method of adaptive testing of singulated semiconductor devices using the socket assembly of the present disclosure. Electrical devices on the socket assembly can monitor performance of the circuit member being tested and signal the test station to modify the test protocol accordingly. The test station can also be signaled to modify the circuit member.

BRIEF DESCRIPTION OF THE SEVERAL VIEWS OF THE DRAWING

FIG. 13 illustrates an alternate compliant printed circuit with optical features for a socket assembly in accordance with an embodiment of the present disclosure.

FIG. 14 illustrates a method of reworking contact members on a compliant printed circuit for a socket assembly in accordance with an embodiment of the present disclosure.

FIG. 15 illustrates a socket assembly in accordance with an embodiment of the present disclosure.

FIG. 16 illustrates a pick and place system used with a socket assembly in accordance with an embodiment of the present disclosure.

DETAILED DESCRIPTION OF THE INVENTION

The present disclosure relates to a high performance socket assembly capable of interconnecting one or more IC devices in a solderless interface, permitting the IC device to be tested prior to final packaging. The present socket assembly can be used with IC devices having contact-to-contact spacing (pitch) on the order of less than about 1.0 millimeter ($1 \times 10^{-3}$ meters), and more preferably a pitch of less than about 0.7 millimeter, and most preferably a pitch of less than about 0.4 millimeter.

Figure 1:
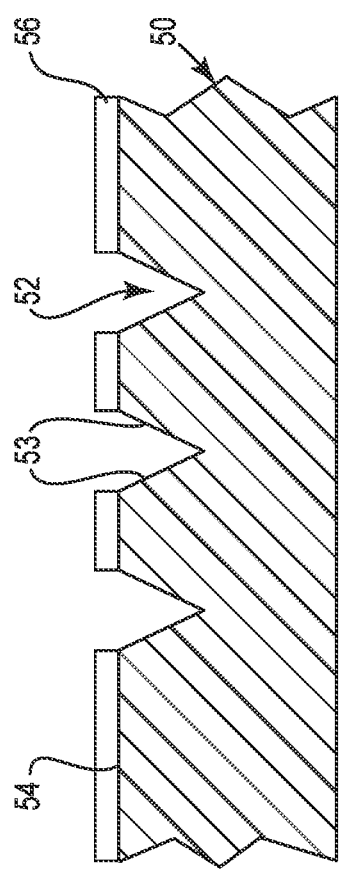
FIG. 1 is a cross-sectional view of a fixture for making a compliant printed circuit for a socket assembly in accordance with an embodiment of the present disclosure.

FIG. 1 is a cross-sectional view of a fixture 50 useful in making a compliant printed circuit for a socket assembly in accordance with an embodiment of the present disclosure. The fixture 50 can include a plurality of cavities 52 in a first surface 54. The locations of the cavities 52 are arranged in an array that corresponds to terminals on a wafer-level IC device (see e.g., FIG. 6). The cavities 52 can be formed using a variety of techniques, such as molding, machining, printing, imprinting, embossing, etching, coining, and the like. Inner surfaces 53 of the cavities 52 can be pretreated preparatory to formation of the compliant printed circuit.

A base layer 56 is preferably located on the first surface 54 of the fixture 50. In one embodiment, the base layer 56 is printed onto the first surface 54, while leaving the cavities 52 exposed. In another embodiment, the base layer 56 is applied to the first surface 54 before the cavities 52 are formed. The base layer 56 can facilitate removal of compliant printed circuit 70 from the fixture 50 (see FIG. 6). The base layer 56 is preferably a dielectric material that also acts as an electrical insulator and a carrier layer for the compliant printed circuit 70.

The fixture 50 can be constructed from a variety of materials, such as for example metal, plastic, ceramics, and composites thereof. In one embodiment, the fixture 50 is made from a resist material that can be dissolved to release the compliant printed circuit 70. Making the fixture 50 from a dissolvable material can permit the contact members (such as the contact members 60 shown in FIG. 6) to have a variety of internal features, undercuts, or cavities that are difficult or typically not possible to make using conventional molding or machining techniques, referred to herein as a "non-moldable features." The cavities 52 can be optionally coated with a material to facilitate release of the contact members 60 from the fixture 50.

Figure 2:
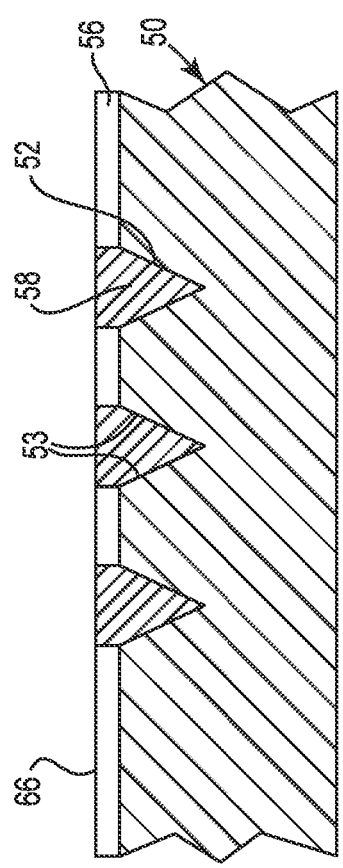
FIG. 2 illustrates contact members formed in the fixture of FIG. 1.

As illustrated in FIG. 2, conductive material 58 is deposited in the cavities 52. The conductive material 58 may be deposited up to a top surface 66 of the base layer 56. In one embodiment, the conductive material 58 may be a metallic powder that can be sintered to create contact members 60 (see FIG. 6). In another embodiment, the conductive material 58 is a flowable, curable conductive material. Various methods for maskless deposition of electronic materials, such as inkjet printing technology as will be described below, may also be used to deposit the conductive material 58 in the cavities 52.

As mentioned above, in one embodiment, the inner surfaces 53 of the cavities 52 can be optionally pretreated before deposition of the conductive material 58. For example, the inner surfaces 53 can be coated with particles of rhodium and then sintered. The sintered rhodium is then coated with nickel or copper. In another embodiment, the inner surfaces 53 can be coated with a low friction material that facilitates removal of the contact members 60 (see FIG. 6) from the fixture 50.

The conductive material 58 is preferably deposited in a first state and then processed to create a second more permanent state. For example, a metallic powder can be deposited in the cavities and subsequently sintered, or a curable conductive material may flow into the cavities 52 and can be subsequently cured. As used herein "cure" and inflections thereof refers to a chemical-physical transformation that allows a material to progress from a first form (e.g., flowable form) to a more permanent second form. The term "curable" refers to a characteristic of a material having the potential to be cured, such as for example by the application of a suitable energy source.

Figure 3:
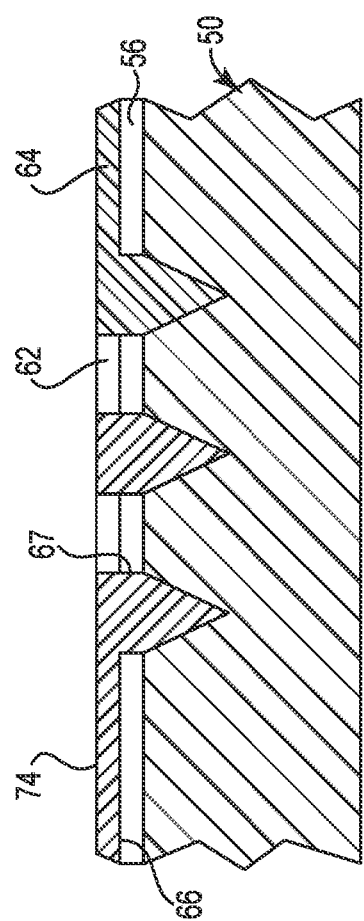
FIG. 3 illustrates conductive traces coupled to the contact members of FIG. 2.

FIG. 3 illustrates dielectric layers 62 and conductive traces 64 deposited, such as by printing, on an exposed top surface 66 of base layer 56. In one embodiment, the conductive traces 64 can be created by sintering or printing a platable target that is subsequently plated with a conductive material. In one embodiment, the plating is optionally applied using printing technology, such as for example inkjet printing technology, aerosol printing technology, or other maskless deposition process. The printing process is additive in nature. Digital images of the dielectric layers 62 and conductive traces 64 are printed directly on the surface 66, eliminating or reducing many of the lithography, plating, and etching steps used to manufacture conventional sockets. The resulting compliant printed circuit 70 (see FIG. 6) provides high frequency capability, and can reduce manufacturing production time and cost by orders of magnitude.

The use of additive printing processes can permit a wide variety of materials to be applied on a layer with a registration relative to the features of the previous layer. Selective addition of conductive, non-conductive, or semi-conductive materials at precise locations to create a desired effect can offer advantages in tuning impedance or adding electrical function on a given layer. Tuning performance on a layer by layer basis relative to the previous layer can greatly enhance electrical performance.

In one embodiment, recesses 67 (or trenches) formed in the base layer 56 can permit control of the location, cross section, material content, and aspect ratio of the contact members 60 (shown in FIG. 6) and the conductive traces 64. Maintaining the conductive traces 64 with a cross-section of 1:1 or greater can provide greater signal integrity than traditional subtractive trace forming technologies. For example, traditional methods take a sheet of a given thickness and etch the material between the traces away to have a resultant trace that is usually wider than it is thick. The etching process also removes more material at the top surface of the trace than at the bottom, leaving a trace with a trapezoidal cross-sectional shape, degrading signal integrity in some applications.

Using recesses to control the aspect ratio of the conductive traces 64 can result in a more rectangular or square cross-section of the conductive traces, with a corresponding improvement in signal integrity. The use of additive printing processes also permits conductive material, non-conductive material, and semi-conductive material to be simultaneously located on a single layer.

In another embodiment, pre-patterned or pre-etched thin conductive foil circuit traces can be transferred to the recesses 67. For example, a pressure sensitive adhesive can be used to retain the copper foil circuit traces in the recesses 67. The trapezoidal cross-sections of the pre-formed conductive foil traces are then post-plated. The plating material fills the open spaces in the recesses 67, resulting in a substantially rectangular or square cross-sectional shape corresponding to the shape of the recesses 67.

In another embodiment, a thin conductive foil is pressed into the recesses 67, and the edges of the recesses 67 act to cut or shear the conductive foil. The process positions a portion of the conductive foil in the recesses 67, but leaves the negative pattern of the conductive foil not wanted outside and above the recesses 67 for easy removal. Again, the foil in the recesses 67 is preferably post plated to add material to increase the thickness of the conductive traces 64 and to fill any voids left between the conductive foil and the recesses 67.

Figure 4:
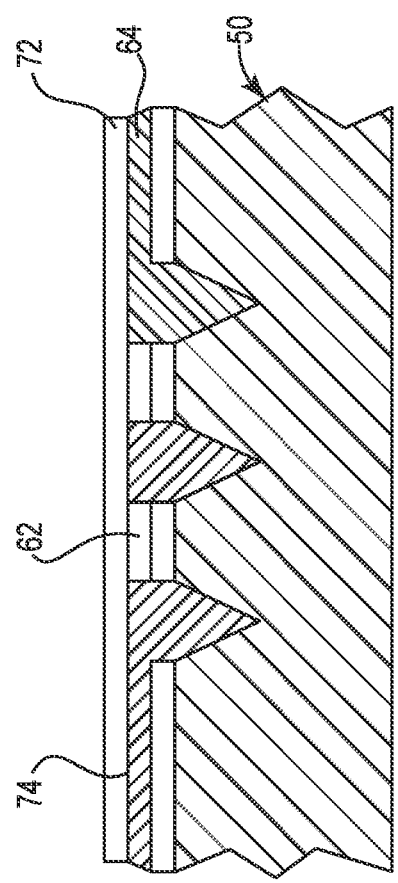
FIG. 4 illustrates a compliant layer added to the assembly of FIG. 3.

FIG. 4 illustrates a compliant layer 72 deposited on a surface 74 of the dielectric layers 62 and the conductive traces 64. The compliant layer 72 is preferably printed onto the surface 74. The compliant layer 72 can be printed using inkjet printing technology, aerosol printing technology, or other maskless deposition techniques as previously described. The compliant layer 72 provides normal force and actuation compliance. In another embodiment, the compliant layer 72 can be bonded to the surface 74. As used herein, "bond" or "bonding" refers to, for example, adhesive bonding, solvent bonding, ultrasonic welding, thermal bonding, or any other techniques suitable for attaching adjacent layers to a substrate.

Figure 5:
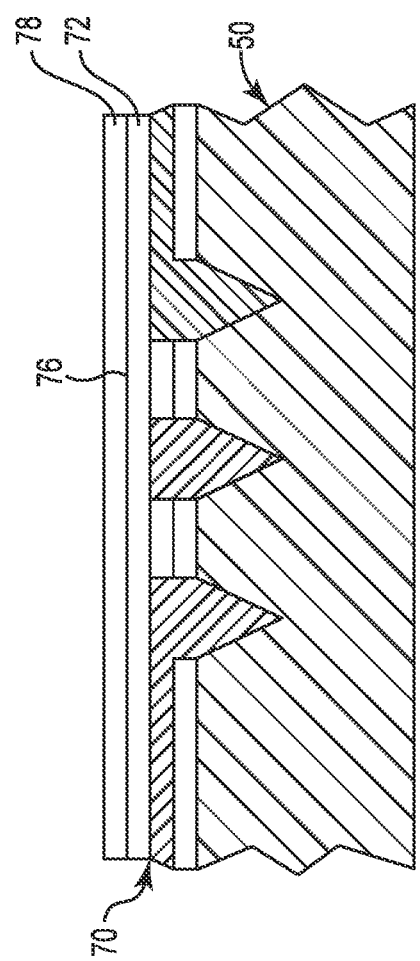
FIG. 5 illustrates a protective layer added to the assembly of FIG. 4.

Finally, FIG. 5 illustrates a protective layer 78 added to a top surface 76 of the compliant layer 72. The protective layer 78 can be applied using printing technology or can be a patterned film bonded to the top surface 76. The added protective layer 78 may complete the compliant printed circuit 70.

Various methods for maskless deposition of electronic materials and forming electrical devices and features may also be used, such as disclosed in U.S. Pat. No. 7,485,345 (Renn et al.); U.S. Pat. No. 6,825,829 (Albert at al.); and U.S.

Pat. Publication No. 2008/0008822 (Kowalski et al.), which are hereby incorporated by reference. Inkjet printing technology, aerosol printing technology, and other printing technology are examples of maskless deposition which can be used to deposit features.

The availability of printable silicon inks provides the ability to print the conductive material 58 and other electrically active materials to form electrical devices and features. Exemplary embodiments of printable silicone inks are disclosed, for example, in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. For example, conductive material can be deposited in the cavities using printing technology.

Printing processes can preferably be used to fabricate various functional structures, such as conductive paths and electrical devices without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process can be followed by a thermal treatment, such as in a furnace or with a laser, to achieve dense functionalized structures.

U.S. Pat. No. 6,506,438 (Duthaler et al.) and U.S. Pat. No. 6,750,473 (Amundson et al.), which are incorporated herein by reference, teach using inkjet printing to make various electrical devices, such as resistors, capacitors, diodes, inductors (or elements which can be used in radio applications or magnetic or electric field transmission of power or data), semiconductor logic elements, electro-optical elements, transistors (including, light emitting, light sensing or solar cell elements, field effect transistors, top gate structures), and the like.

U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference, teach using aerosol printing to create various electrical devices and features.

Printing of electronically active inks can be done on a large class of substrates, without the requirements of standard vacuum processing or etching. The inks may incorporate mechanical, electrical or other properties, such as, conducting, insulating, resistive, magnetic, semiconductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinylidenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (Dec. 1996). A field effect transistor made with a-hexathienylene is described in U.S. Pat. No. 5,659,181 (Bridenbaugh et al.), which is incorporated herein by reference.

A protective layer can optionally be printed onto the electrical devices and features. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

An inkjet print head, or other print head, preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electropneumatic, electrostatic, rapid ink heating, magnetohydrodynamic, or any other technique well known to those skilled in the art. The deposited ink patterns typically undergo a curing step or another processing step before subsequent layers are applied.

While inkjet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; aerosol printing processes; and other similar techniques.

Figure 6:
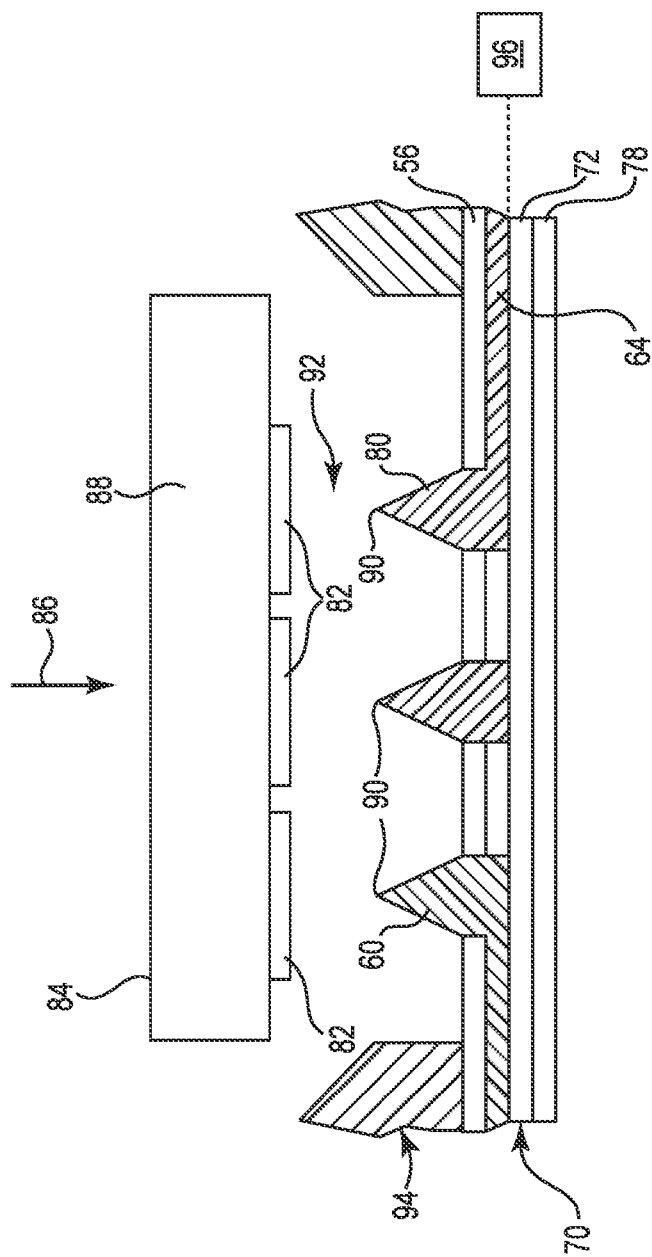
FIG. 6 is a cross-sectional view of a compliant printed circuit in a socket assembly in accordance with an embodiment of the present disclosure.

FIG. 6 illustrates the compliant printed circuit 70 removed from the fixture 50 (shown in FIGS. 1-5) and integrated into socket assembly 94. Conductive traces 64 are electrically coupled to another circuit member 96, such as for example, a printed circuit board, a test assembly, a packaged integrated circuits, unpackaged integrated circuits, flexible circuits, bare-die devices, organic or inorganic substrates, or any other device capable of carrying electrical current.

Exposed portions 80 of the contact members 60 are optionally plated. In another embodiment, the contact members 60 are further processed, such as for example by coining or etching, to facilitate engagement with terminals 82 on singulated die 88. In operation, force 86 is applied to rear surface 84 of the singulated die 88 so the distal ends 90 of the contact members 60 electrically couple with the terminals 82. The compliant layer 72 can compensate for non-planarity at the interface 92.

Figure 7:
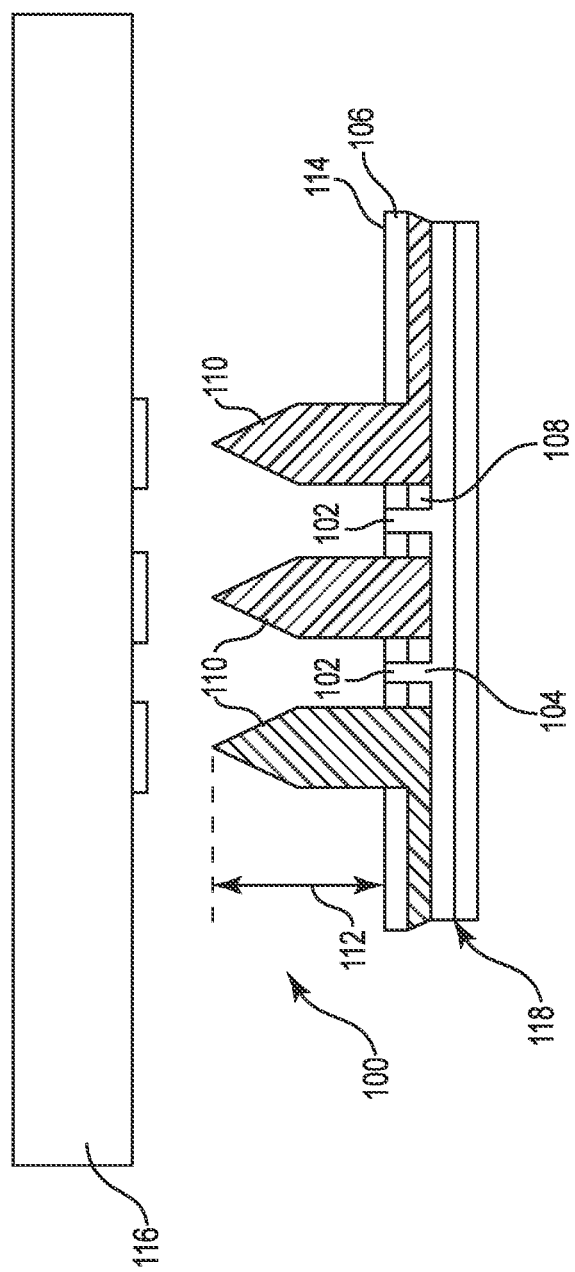
FIG. 7 is a cross-sectional view of an alternate compliant printed circuit in a socket assembly in accordance with an embodiment of the present disclosure.

FIG. 7 is a schematic illustration of an alternate socket assembly 100 with gaps 102, 104 in dielectric layers 106, 108 of the printed compliant circuit 118 in accordance with an embodiment of the present disclosure. In the illustrated embodiment, the gaps 102, 104 are located substantially adjacent to contact members 110 to provide a degree of compliance. The gaps 102, 104 decouple compliance of contact members 110 from the dielectric layers 106, 108.

A height 112 of the contact members 110 can be increased to reduce the chance of a top surface 114 of the dielectric layer 106 contacting IC device 116. For example, the depth of the cavities 52 in the fixture 50 of FIG. 1 can be increased to create the longer contact members 110 of FIG. 7.

Figure 8:
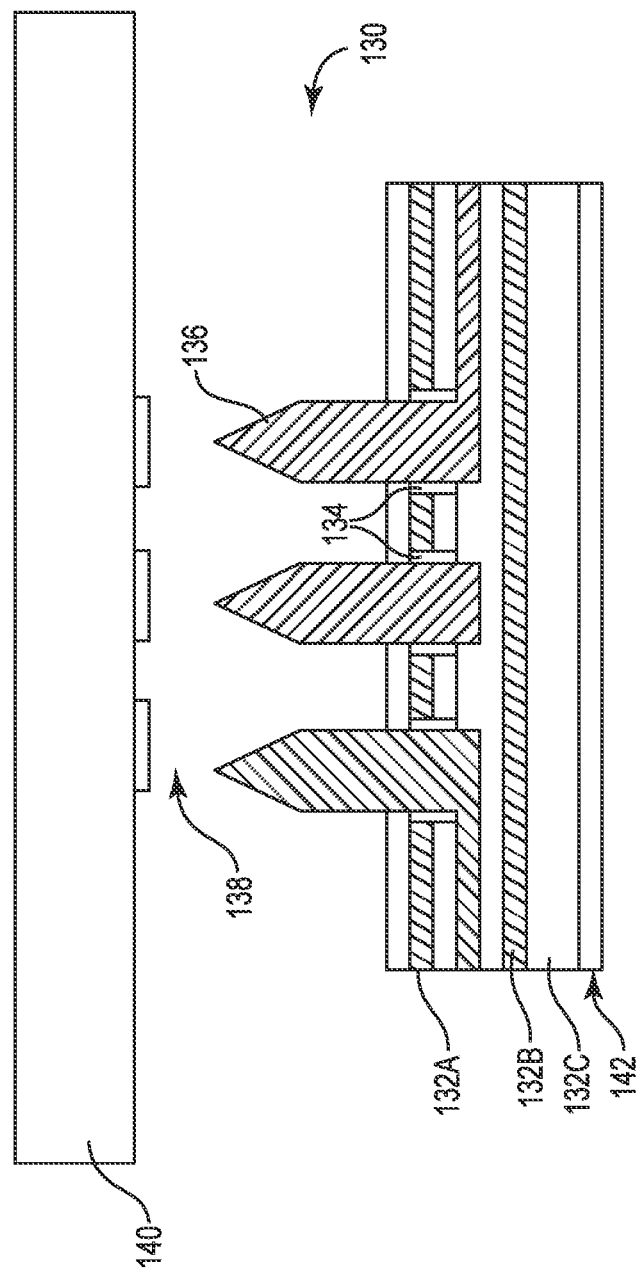
FIG. 8 is a cross-sectional view of a compliant printed circuit with circuitry layers in a socket assembly in accordance with an embodiment of the present disclosure.

FIG. 8 is a schematic illustration of an alternate socket assembly 130 with additional functional layers 132A, 132B, 132C (collectively "132") in the compliant printed circuit 142, in accordance with an embodiment of the present disclosure. The functional layers can be, for example, specialty dielectrics, ground planes, power planes, shielding layers, stiffening layers, capacitive coupling features, circuitry layers, and the like. The layers 132 can be printed or preformed and selectively bonded or non-bonded to provide contiguous material or releasable layers.

In the illustrated embodiment, layers 132A and 132B are ground planes. Layer 132C is a compliant layer that operates in either alone or in conjunction with gaps 134 adjacent to the contact members 136 to compensate for non-planarity at the interface 138 with the wafer 140.

Figure 9:
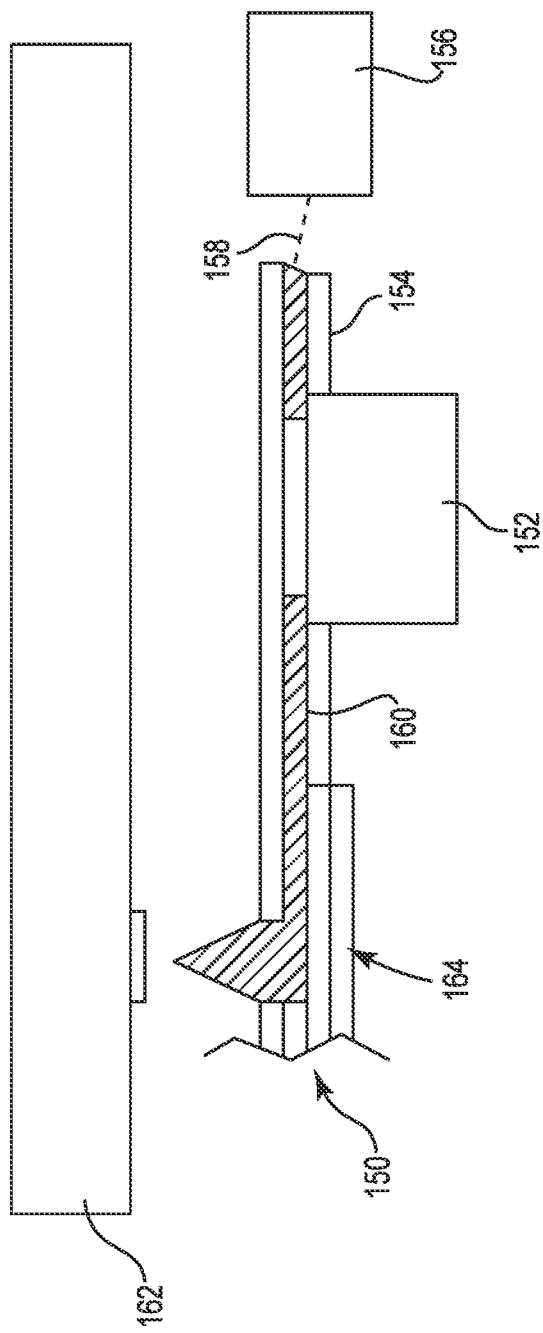
FIG. 9 is a cross-sectional view of a compliant printed circuit with electrical devices in a socket assembly in accordance with an embodiment of the present disclosure.

FIG. 9 is a schematic illustration of a socket assembly 150 with additional electrical devices 152 located on the printed compliant circuit 164 in accordance with embodiments of the present disclosure. The electrical devices 152 can be capacitors, transistors, resistors, filters, signal or power altering and enhancing devices, memory devices, an embedded IC, an RF antennae, and the like. The electrical devices 152 can be located on surface 154 or embedded in one of the layers. The socket assembly 150 can include an extension 158, such as for example a flexible circuit member, electrically coupling conductive traces 160 to another circuit member 156. As used herein, the term "circuit members" refers to, for example, a packaged integrated circuit device, an unpackaged integrated circuit device, a printed circuit board, a test station, a flexible circuit, a bare-die device, an organic or inorganic substrate, a rigid circuit, or any other device capable of carrying electrical current.

The electrical devices 152 can be added as discrete components or printed onto one of the layers. The electrical devices 152 can be printed using inkjet printing technology, aerosol printing technology, or other maskless deposition techniques, as previously described. Electrical devices that are typically located on the test station 156 can be incorporated into the socket assembly 150, improving electrical performance.

In one embodiment, the electrical devices 152 monitor the testing of the circuit member 162 and communicate feedback to the test station 156. In one embodiment, a feedback signal from the electronic devices 152 can cause the test station 156 to alter the testing protocol depending on the performance of the circuit member 162, referred to as adaptive testing. In one embodiment, the feedback signal from the electronic devices 152 can cause the test station 156 to alter the circuit member 162, such as for example, by altering software resident on the circuit member 162.

Figure 10:
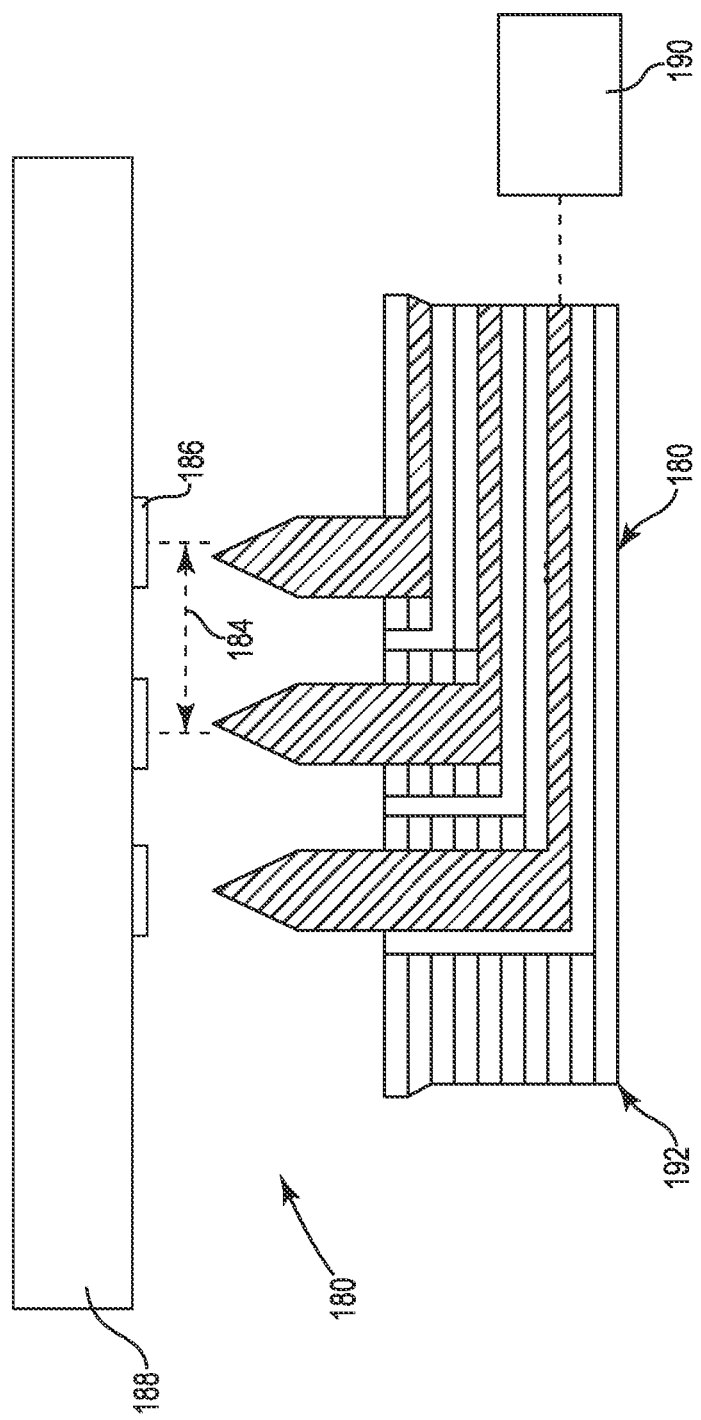
FIG. 10 is a cross-sectional view of a multi-layered compliant printed circuit in a socket assembly in accordance with an embodiment of the present disclosure.

FIG. 10 is a cross-sectional view of a socket assembly 180 with a multiple layer 182 printed complaint circuit 192 in accordance with an embodiment of the present disclosure. The socket assembly 180 permits IC manufactures to reduce the pitch 184 of the terminals 186 on the IC devices 188 since the required signal routing to a test station 190 is performed by the socket assembly 180.

Figure 11:
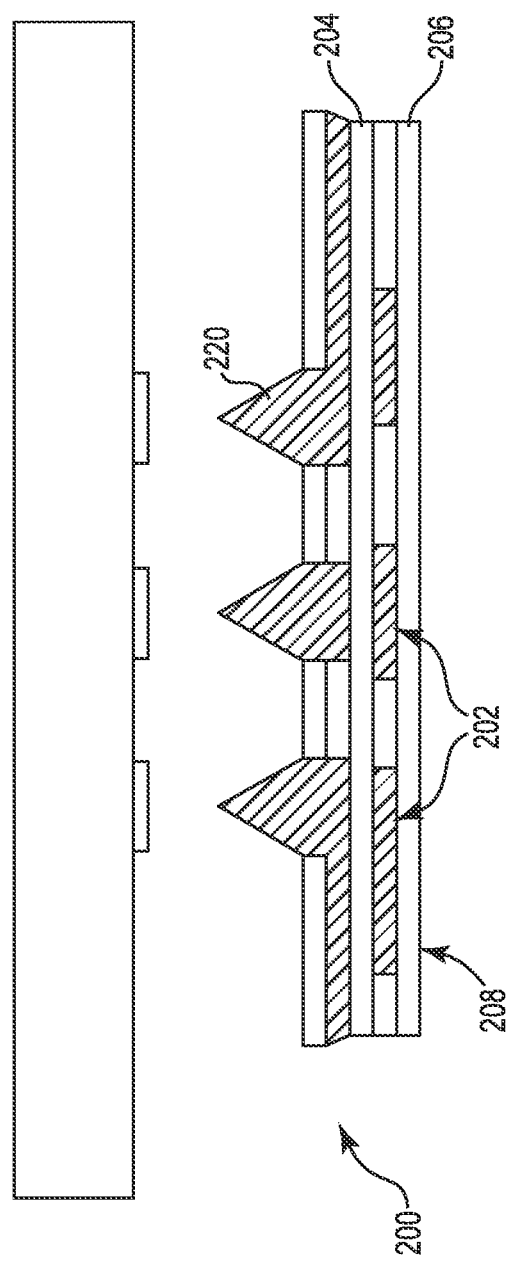
FIG. 11 is a cross-sectional view of a compliant printed circuit with coupling features in a socket assembly in accordance with an embodiment of the present disclosure.

FIG. 11 is a cross-sectional view of a socket assembly 200 with coupling features 202 printed into the printed compliant circuit 208 in accordance with an embodiment of the present disclosure. In one embodiment, the coupling features 202 can be capacitive couplings located between dielectric layers 204, 206. In another embodiment, the coupling features 202 can be optical fibers supported by the dielectric layers 204, 206. Optical quality materials can optionally be printed directly onto the dielectric layers 204, 206. The printing process can also allow for deposition of coatings in-situ that will enhance the optical transmission or reduce loss. The precision of the printing process can resolve misalignment issues when the optical fibers 202 are placed into a connector. In another embodiment, the coupling features 202 can be embedded coaxial or printed micro strip RF circuits with dielectric layers 204, 206. The dielectric layers 204, 206 can be formed of metal. Any of the structures noted above, as well as the contact members 220, can be created by printing dielectrics and metallization geometry.

Figure 12:
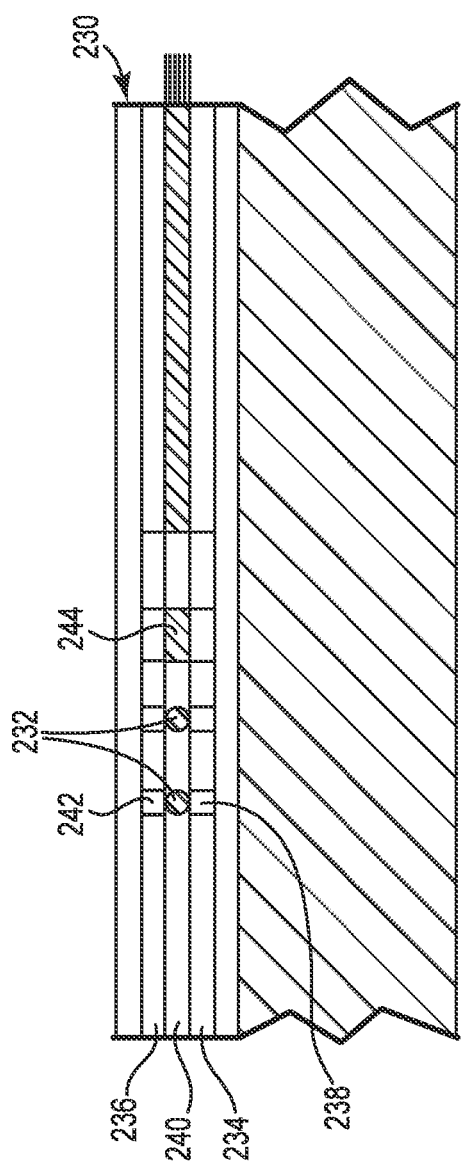
FIG. 12 illustrates a compliant printed circuit with optical features for a socket assembly in accordance with an embodiment of the present disclosure.

FIG. 12 illustrates an alternate printed compliant circuit 230 for a socket assembly in accordance with an embodiment of the present disclosure. Optical fibers 232 are located between layers 234, 236 of dielectric material. In one embodiment, optical fibers 232 are positioned over printed compliant layer 238, and dielectric layer 240 is printed over and around the optical fibers 232. A compliant layer 242 is preferably printed above the optical fiber 232 as well. The compliant layers 238, 242 support the optical fibers 232 during flexure. In another embodiment, the dielectric layer 240 is formed or printed with recesses into which the optical fibers 232 are deposited.

In another embodiment, optical quality materials 244 are printed during printing of the compliant printed circuit 230. The optical quality material 244 and/or the optical fibers 232 comprise optical circuit geometries. The printing process allows for deposition of coatings in-situ that enhances the optical transmission or reduces loss. The precision of the printing process reduces misalignment issues when the optical materials 244 are optically coupled with another optical structure.

FIG. 13 illustrates another embodiment of a printed compliant circuit 250 for a socket assembly in accordance with an embodiment of the present disclosure. Embedded coaxial RF circuits 252 or printed micro strip RF circuits 254 are located with dielectric/metal layers 256. These RF circuits 252, 254 are preferably created by printing dielectrics and metallization geometry.

FIG. 14 illustrates a printed compliant circuit 260 on which damaged contact members are removed and new contact members 262 are re-printed. Although the illustrated embodiment discloses triangular shaped contact members 262, a variety of other non-triangular shapes can be created using printing technology.

FIG. 15 is an alternate socket assembly 300 with additional functionality built into the compliant printed circuit 302 in accordance with an embodiment of the present disclosure. One or more of the layers 304A, 304B, 304C, 304D, and 304E (collectively "304") can include additional functionality, such as for example, specialty dielectrics, ground planes, power planes, shielding layers, stiffening layers, capacitive coupling features, circuitry layers, and the like. The layers 304 can be printed or preformed and selectively bonded or non-bonded to provide contiguous material or releasable layers.

The additional functionality can also be provided by additional electrical devices 306, preferably positioned adjacent to opening 308 in socket housing 310 that receives the IC device 312. The electrical devices 306 can be shielding, near device decoupling, capacitors, transistors, resistors, filters, signal or power altering and enhancing devices, memory devices, embedded IC, RF antennae, and the like. The electrical devices 306 can be added as discrete components or printed onto one of the layers. The electrical devices 306 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

In one embodiment, the compliant printed circuit 302 extends beyond a perimeter edge 314 of the socket housing 310. In one embodiment, extension 316 including a flexible circuit member can be electrically coupled to the compliant printed circuit 302. In the illustrated embodiment, the compliant printed circuit 302 is electrically coupled to test station 320 via the extension 316. The testing protocol can reside in the electrical device 306 or the test station 320, or a combination thereof. The test station 320 can be, for example, a logic analyzer, a PC-based test platform, and the like.

In one embodiment, the electrical device 306 monitors the testing of the IC device 312 and communicates feedback to test station 320. In one embodiment, the feedback signal from the electrical devices 306 can cause the test station 320 to alter the testing protocol based on the performance of the IC device 312. This methodology is also referred to as adaptive testing. In one embodiment, the feedback signal from the electrical devices 306 can cause the test station 320 to alter the IC device 312, such as for example, by altering software resident on the IC device 311.

FIG. 16 illustrates the use of pick and place system 350 to position singulated die 352 relative to socket assembly 354 in accordance with an embodiment of the present disclosure. Due to the fine pitch of terminals 356, edge alignment of the singulated die 352 is not likely reliable in many cases. Pick and place system 350 with split vision or optical alignment is used to align die terminals 356 to the contact tips 358. Pick up chuck 360 is optionally used to apply load or provide thermal management.

In the illustrated embodiment, contact tips 358 are shaped to facilitate electrical coupling with protruding terminals 356 on the singulated die 352. In one embodiment, shape of the contact tips 358 is established by altering the shape of cavities 52 in fixture 50 (see e.g., FIG. 1). In another embodiment, the shape of the contact tips 358 can be created using the additive printing processes discussed herein.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the present disclosure. The upper and lower limits of these smaller ranges which may independently be included in the smaller ranges is also encompassed within the embodiments of the invention, subject to any specifically excluded limit in the stated range. Where the stated range includes one or both of the limits, ranges excluding either or both of those included limits are also included in the embodiments of the invention.

Unless defined otherwise, all technical and scientific terms used herein have the same meaning as commonly understood by one of ordinary skill in the art to which the embodiments of the invention belong. Although any methods and materials similar or equivalent to those described herein can also be used in the practice or testing of the embodiments of the present disclosure, the preferred methods and materials are now describe. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the embodiments of the present disclosure are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the invention. It should be understood that various features and aspects of the disclosed embodiments can be combined with or substituted for one another in order to form varying modes of the disclosed embodiments of the present disclosure. Thus, it is intended that the scope of at least some of the present disclosure herein disclosed should not be limited by the particular disclosed embodiments described above.

Thus, the scope of this invention should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making a socket assembly that forms a solderless electrical connection between terminals on a singulated integrated circuit device and another circuit member, the method comprising the steps of:
   printing a base layer of a dielectric material onto a surface of a fixture, while leaving cavities in the fixture exposed;
   depositing a conductive material into a plurality of the cavities in the fixture;
   printing at least one dielectric layer with recesses corresponding to a target circuit geometry on the dielectric base layer;
   depositing a conductive material in at least a portion of the recesses comprising conductive traces electrically coupled to the contact members of a compliant printed circuit;
   removing the compliant printed circuit from the fixture to expose distal ends of the contact members; and
   positioning the compliant printed circuit relative to an opening in a socket housing so the contact members electrically couple with the terminals on a singulated integrated circuit device located in the opening.

2. The method of claim 1 wherein the conductive traces comprise substantially rectangular cross-sectional shapes.

3. The method of claim 1 comprising printing a conductive material, a non-conductive material, and a semi-conductive material on a single layer of the compliant printed circuit.

4. The method of claim 1 comprising:
   positioning pre-formed conductive trace materials in recesses of in the dielectric layer; and
   plating the recesses of the dielectric layer to form conductive traces with substantially rectangular cross-sectional shapes.

5. The method of claim 1 comprising:
   pressing a conductive foil into at least a portion of recesses in the dielectric layer;
   shearing the conductive foil along edges of the recesses;
   removing excess conductive foil not located in the recesses; and
   plating the recesses to form conductive traces with substantially rectangular cross-sectional shapes.

6. The method of claim 1 comprising the step of forming at least one additional circuitry plane in the socket assembly.

7. The method of claim 1 comprising the steps of:
   printing at least one electrical device on the socket assembly; and
   electrically coupling a plurality of the electrical devices to at least one conductive trace.

8. The method of claim 1 comprising printing an optical quality material in at least a portion of the recesses comprising one or more optical circuit geometries.

9. The method of claim 1 comprising locating one or more optical fibers in at least a portion of the recesses comprising one or more optical circuit geometries.

10. The method of claim 1 wherein the other circuit member is selected from one of a printed circuit board, a flexible circuit, a bare die device, an integrated circuit device, and a test station.

11. A method of making a socket assembly that forms a solderless electrical connection between terminals on a circuit member, the method comprising the steps of:
   printing a base layer of a dielectric material onto a surface of a fixture, while leaving cavities in the fixture exposed;
   depositing a conductive material into a plurality of the cavities in the fixture;
   printing at least one dielectric layer with recesses corresponding to a target circuit geometry on the dielectric base layer;
   depositing a conductive material in at least a portion of the recesses comprising conductive traces;
   electrically coupling at least one of the conductive traces to at least one of the contact members of a compliant printed circuit;
   removing the compliant printed circuit from the fixture to expose distal ends of the contact members;
   positioning the compliant printed circuit adjacent to an opening in a housing so that an extension of the compliant printed circuit extends beyond a perimeter edge of the housing; and
   electrically coupling the contact members to the terminals on a circuit member located in the opening.

12. The method of claim 11 comprising electrically coupling the extension of the compliant printed circuit to one of a printed circuit board, a test assembly, a packaged integrated circuit, an unpackaged integrated circuit, a flexible circuit, a bare-die device, or an organic or inorganic substrate.

* * * * *